(12) United States Patent
Ross

(10) Patent No.: US 11,058,022 B1
(45) Date of Patent: Jul. 6, 2021

(54) VERTICAL TRACK AND SLIDING MOUNT FOR A SMOKE DETECTOR

(71) Applicant: Luis Ross, Glendale, NY (US)

(72) Inventor: Luis Ross, Glendale, NY (US)

(*) Notice: Subject to any disclaimer, the term of this patent is extended or adjusted under 35 U.S.C. 154(b) by 112 days.

(21) Appl. No.: 16/565,611

(22) Filed: Sep. 10, 2019

(51) Int. Cl.
*H05K 7/14* (2006.01)
*G08B 17/117* (2006.01)

(52) U.S. Cl.
CPC ............ *H05K 7/14* (2013.01); *G08B 17/117* (2013.01); *F16M 2200/02* (2013.01)

(58) Field of Classification Search
CPC .... G08B 17/10; G08B 17/113; G08B 17/117; H05K 7/14
USPC ......... 248/539, 125.1, 125.8, 161, 241, 243, 248/244
See application file for complete search history.

(56) References Cited

U.S. PATENT DOCUMENTS

| | | | | |
|---|---|---|---|---|
| 40,171 A * | 10/1863 | King | ...................... | F16M 11/10 248/125.1 |
| 576,939 A * | 2/1897 | Baines | ................. | A47B 57/567 248/244 |
| 914,572 A * | 3/1909 | Holden | .................. | A47B 57/16 108/109 |
| 2,069,690 A * | 2/1937 | Wells | ...................... | B65B 25/20 53/256 |
| 2,457,373 A * | 12/1948 | Hunter | ..................... | A47B 5/02 248/244 |
| 2,565,433 A * | 8/1951 | Knight | .................... | D06F 53/04 248/353 |
| 2,902,592 A * | 9/1959 | Rex | .......................... | F21V 21/22 362/277 |
| 3,234,897 A * | 2/1966 | Berk | ...................... | A47B 57/42 108/152 |
| 3,790,770 A * | 2/1974 | Stern | ...................... | A47B 23/06 362/98 |
| 4,055,318 A * | 10/1977 | Duckett | ................. | A47B 57/18 248/243 |
| D246,635 S | 12/1977 | Boldt | | |
| 5,044,508 A * | 9/1991 | Walter | ................... | A47B 57/34 211/207 |
| 5,086,930 A * | 2/1992 | Saeks | ....................... | B62H 3/12 211/17 |
| 5,149,038 A | 9/1992 | VanCleve | | |
| 5,281,954 A | 1/1994 | Harrison | | |
| 5,289,165 A * | 2/1994 | Belin | .................... | G08B 17/113 340/628 |
| 5,519,382 A * | 5/1996 | Pope | ...................... | G08B 17/10 340/627 |

(Continued)

FOREIGN PATENT DOCUMENTS

WO 2008002106 1/2008

*Primary Examiner* — Eret C McNichols
(74) *Attorney, Agent, or Firm* — Kyle A. Fletcher, Esq.

(57) ABSTRACT

The vertical track and sliding mount for a smoke detector comprises a guide tube, a lifting tube, and a mounting base. The mounting base may be adapted to couple to a detector. The mounting base may be coupled to the top end of the lifting tube. The detector be raised and lowered by sliding the lifting tube vertically within the guide tube. As non-limiting examples, the detector may be a smoke detector, carbon monoxide detector, radon detector, natural gas detector, propane detector, or other residential environmental detector or alarm. In some embodiments, a height lock may hold the lifting tube at an elevated position or at a lowered position.

17 Claims, 5 Drawing Sheets

(56) References Cited

U.S. PATENT DOCUMENTS

| | | | |
|---|---|---|---|
| 5,563,766 A | 10/1996 | Long | |
| 5,594,422 A | 1/1997 | Huey, Jr. | |
| 5,615,854 A * | 4/1997 | Nomura | F16M 11/10 248/205.3 |
| 5,680,436 A * | 10/1997 | Nyzen | A61B 6/4429 248/316.4 |
| 6,105,794 A * | 8/2000 | Bauer | A47B 57/26 108/108 |
| 6,164,459 A * | 12/2000 | Liem | B62H 3/12 211/20 |
| 6,446,926 B1 | 9/2002 | Kaschuk | |
| 6,764,055 B1 * | 7/2004 | Lee | A47B 23/00 248/125.1 |
| 6,827,320 B2 * | 12/2004 | Yeh | A47B 57/565 248/220.22 |
| 7,063,296 B2 * | 6/2006 | Williams | F16M 11/10 248/244 |
| 7,233,254 B2 | 6/2007 | Howell | |
| 7,845,601 B1 * | 12/2010 | Culpepper | A61M 5/1418 248/125.2 |
| 8,038,112 B2 * | 10/2011 | Kluge | A47B 96/1466 248/244 |
| 8,371,547 B2 * | 2/2013 | Wilkowske | G08B 17/00 248/310 |
| 8,893,898 B2 * | 11/2014 | Dovner | B62H 3/12 211/17 |
| 10,883,656 B1 * | 1/2021 | Follis | F16M 13/022 |
| 2005/0128094 A1 * | 6/2005 | Howell | G08B 17/10 340/626 |
| 2008/0117064 A1 * | 5/2008 | Shin | G08B 17/10 340/577 |
| 2008/0197253 A1 * | 8/2008 | Thompson | A47B 57/42 248/220.22 |
| 2009/0309743 A1 * | 12/2009 | Tollman | G08B 29/145 340/628 |
| 2012/0193487 A1 * | 8/2012 | Tsao | A61M 1/0001 248/125.1 |
| 2012/0193502 A1 * | 8/2012 | Gatti | F16B 12/02 248/514 |
| 2014/0007678 A1 * | 1/2014 | Lehti | G08B 17/113 73/431 |
| 2015/0376563 A1 * | 12/2015 | Husemann | C12M 23/14 435/289.1 |
| 2020/0408392 A1 * | 12/2020 | Lenz, Jr. | F16M 11/28 |

* cited by examiner

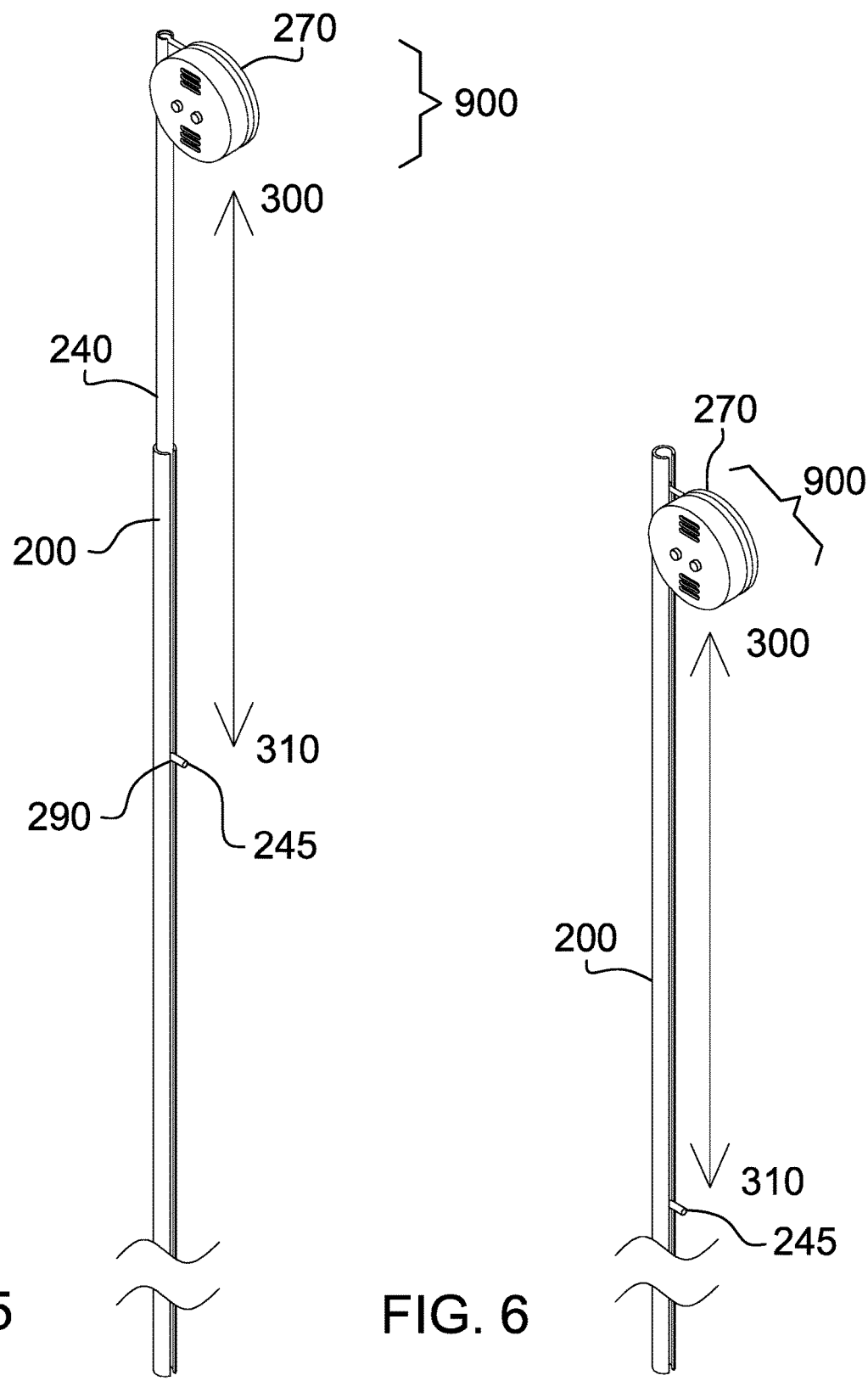

VERTICAL TRACK AND SLIDING MOUNT FOR A SMOKE DETECTOR

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the fields of residential safety devices, more specifically, a vertical track and sliding mount for a smoke detector.

SUMMARY OF INVENTION

The vertical track and sliding mount for a smoke detector comprises a guide tube, a lifting tube, and a mounting base. The mounting base may be adapted to couple to a detector. The mounting base may be coupled to the top end of the lifting tube. The detector be raised and lowered by sliding the lifting tube vertically within the guide tube. As non-limiting examples, the detector may be a smoke detector, carbon monoxide detector, radon detector, natural gas detector, propane detector, or other residential environmental detector or alarm. In some embodiments, a height lock may hold the lifting tube at an elevated position or at a lowered position.

An object of the invention is to provide a guide tube, a lifting tube, and a mounting base adapted to raise and lower a detector.

Another object of the invention is to provide a guide tube that may be mounted in a vertical orientation.

A further object of the invention is to provide a lifting tube that slidably couples to the guide tube.

Yet another object of the invention is to provide a height lock to hold the lifting tube at a height.

These together with additional objects, features and advantages of the vertical track and sliding mount for a smoke detector will be readily apparent to those of ordinary skill in the art upon reading the following detailed description of the presently preferred, but nonetheless illustrative, embodiments when taken in conjunction with the accompanying drawings.

In this respect, before explaining the current embodiments of the vertical track and sliding mount for a smoke detector in detail, it is to be understood that the vertical track and sliding mount for a smoke detector is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the vertical track and sliding mount for a smoke detector.

It is therefore important that the claims be regarded as including such equivalent construction insofar as they do not depart from the spirit and scope of the vertical track and sliding mount for a smoke detector. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

FIG. 5 is a detail view of an embodiment of the disclosure illustrating the detector in the elevated position.

FIG. 6 is a detail view of an embodiment of the disclosure illustrating the detector in the lowered position.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description. As used herein, the word "or" is intended to be inclusive.

Figure 1:
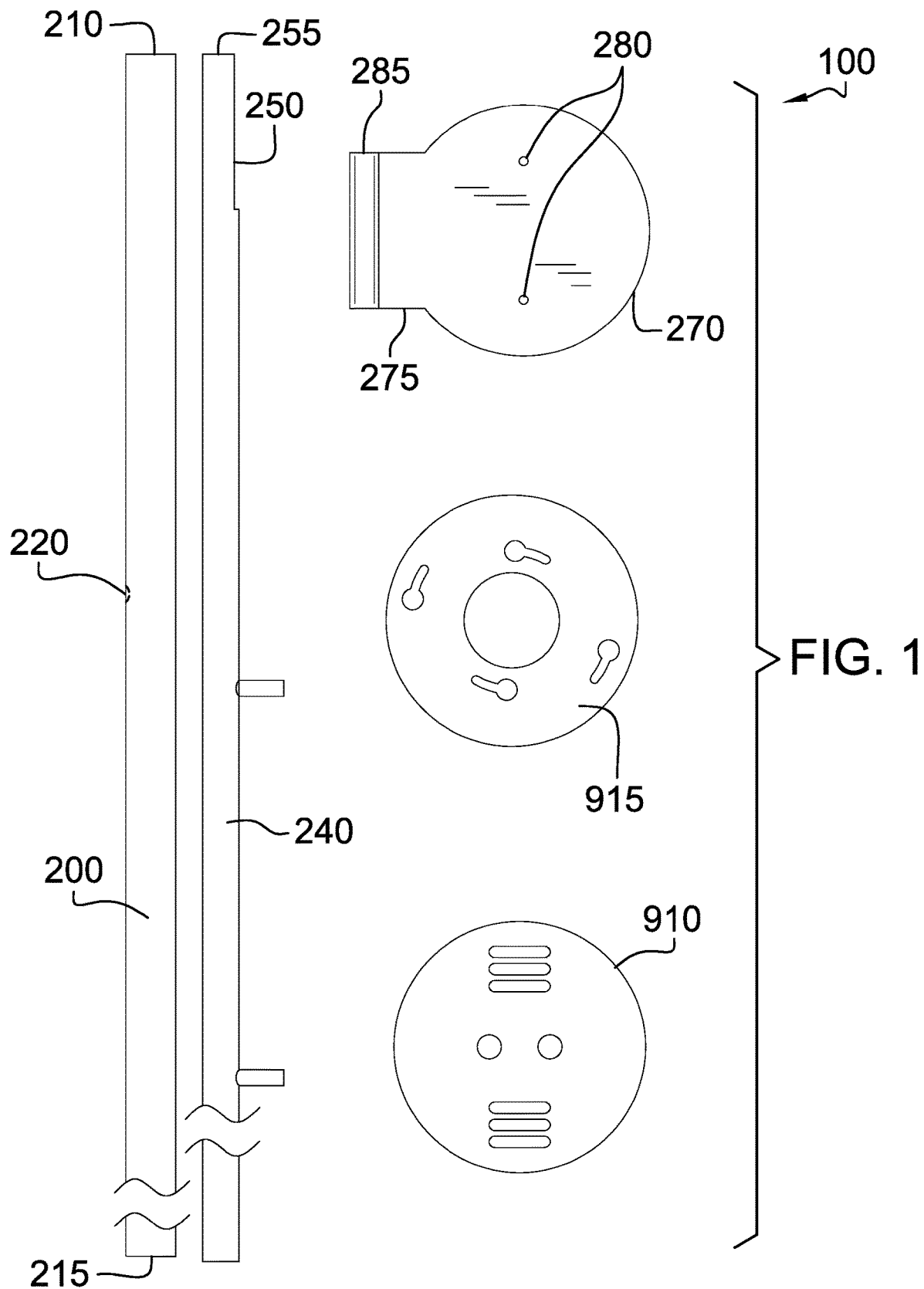
FIG. 1 is a front view of an embodiment of the disclosure.
Figure 2:
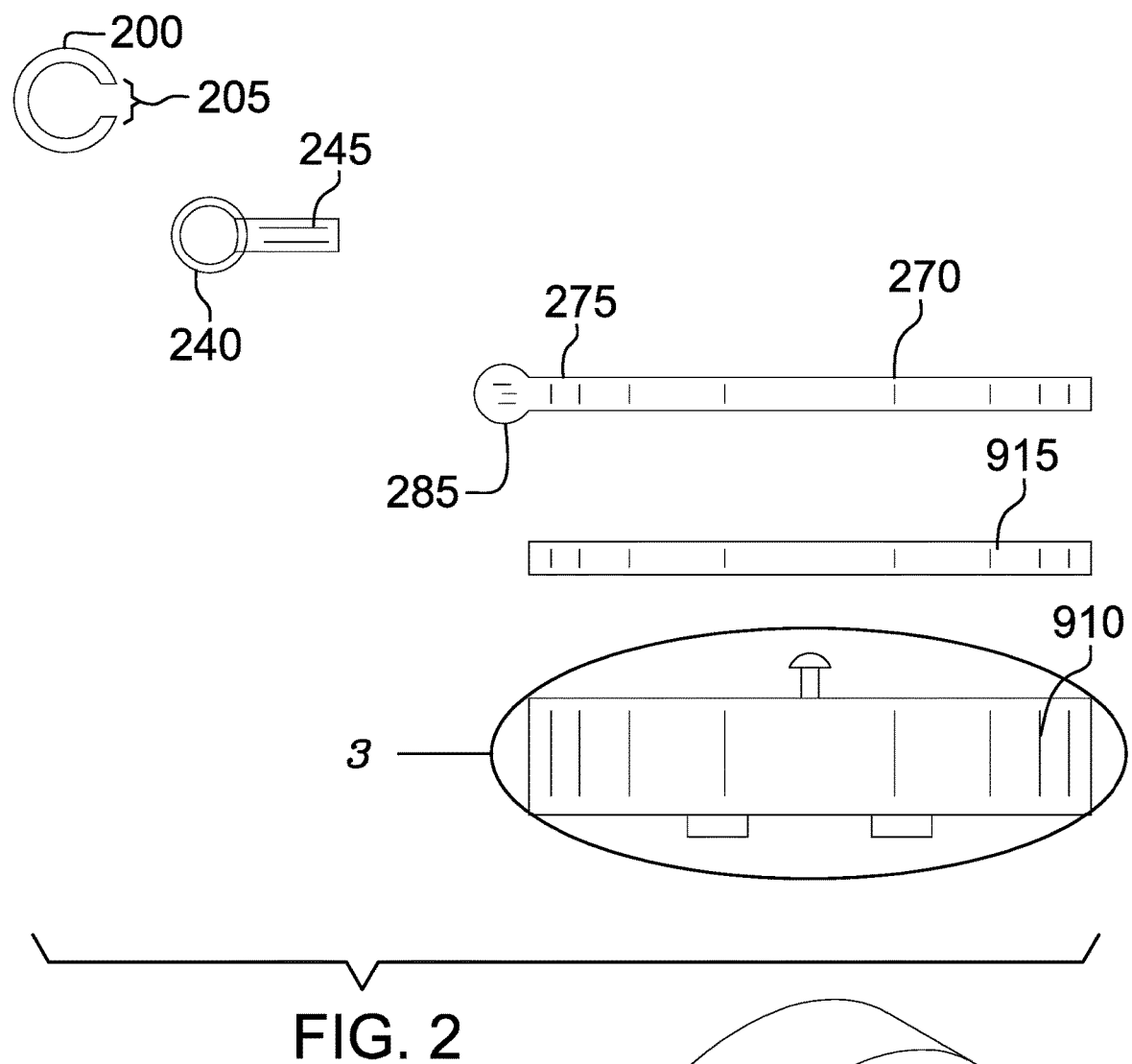
FIG. 2 is a top view of an embodiment of the disclosure illustrating the rear of the detector body.
Figure 3:
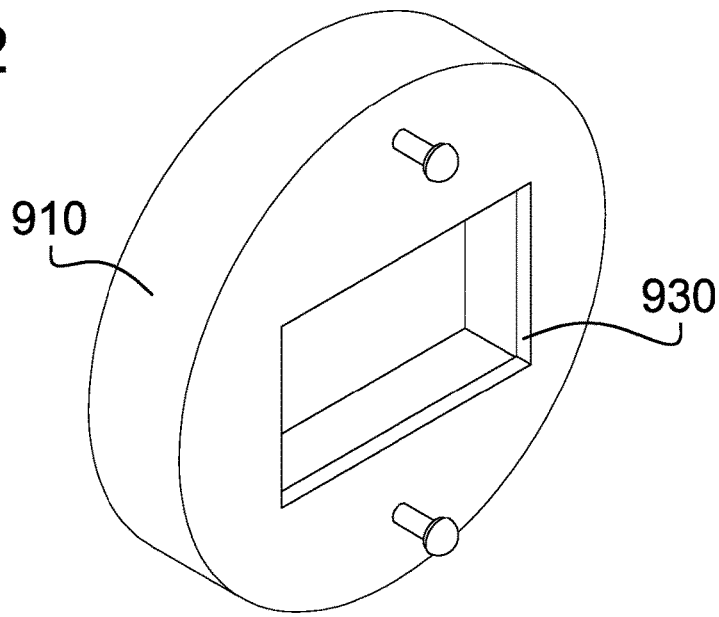
FIG. 3 is a detail rear isometric view of an embodiment of the disclosure.
Figure 4:
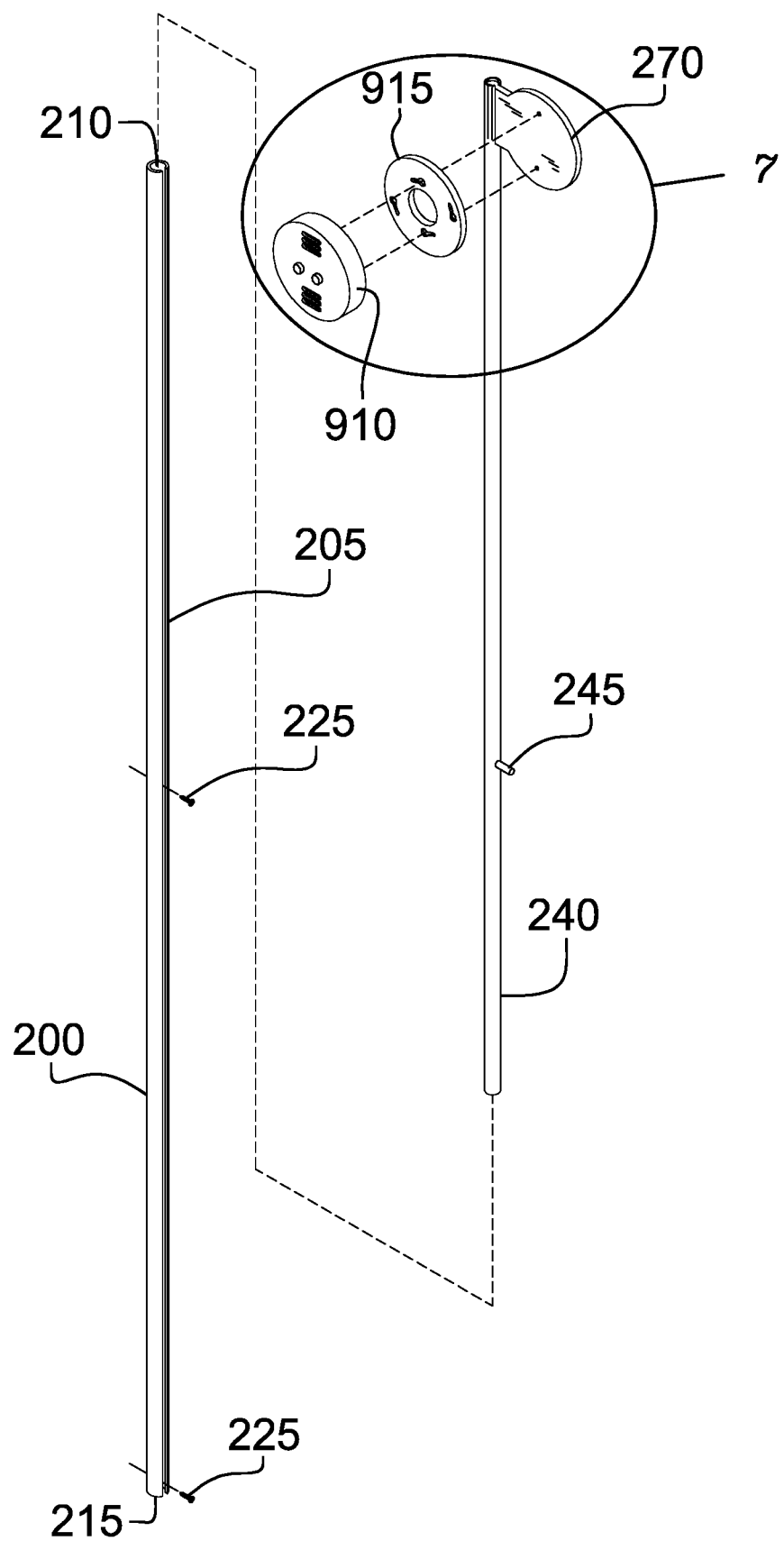
FIG. 4 is an exploded view of an embodiment of the disclosure.
Figure 7:
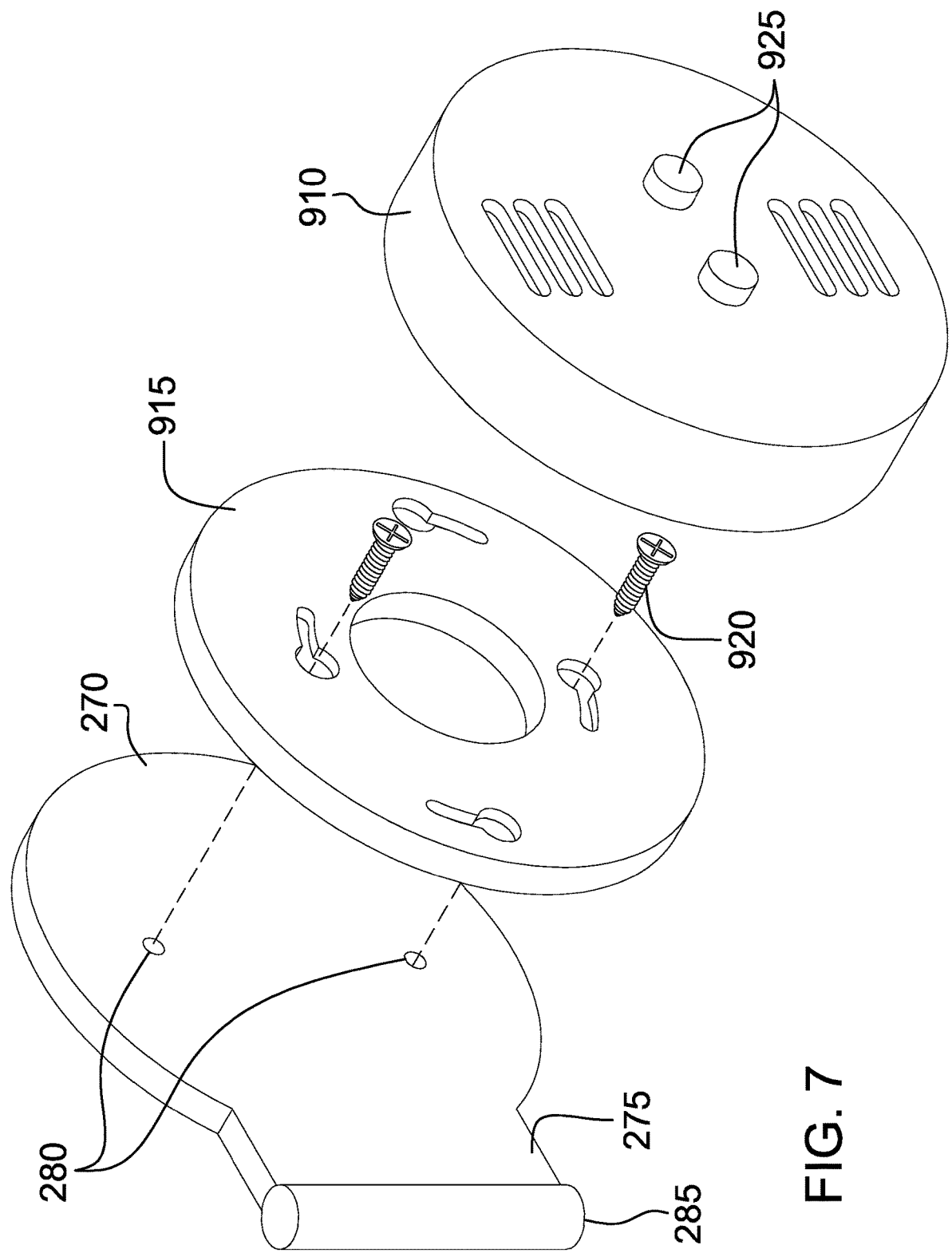
FIG. 7 is a detail isometric view of an embodiment of the disclosure illustrating the coupling of the mounting base, detector bracket, and detector body.

Detailed reference will now be made to a first potential embodiment of the disclosure, which is illustrated in FIGS. 1 through 7.

The vertical track and sliding mount for a smoke detector 100 (hereinafter invention) comprises a guide tube 200, a lifting tube 240, and a mounting base 270. The mounting base may be adapted to couple to a detector 900. The detector 900 may be raised and lowered by sliding the lifting tube 240 vertically within the guide tube 200. As non-limiting examples, the detector 900 may be a smoke detector, carbon monoxide detector, radon detector, natural gas detector, propane detector, or other residential environmental detector or alarm.

The guide tube 200 may be a hollow armature comprising a side slot 205 along the length of the guide tube 200. The guide tube 200 may be coupled to a vertical surface in a vertical orientation. As non-limiting examples, the vertical surface may be a door frame, a wall, or a side of a cabinet. The guide tube 200 may comprise a top guide aperture 210 and a bottom guide aperture 215 such that the lifting tube 240 may slide into and out of the guide tube 200 via either end of the guide tube 200. The guide tube 200 may comprise a plurality of guide mounting apertures 220 located opposite the side slot 205. The guide tube 200 may be coupled to the vertical surface using a plurality of guide mounting screws 225 that pass through the side slot 205 and the plurality of guide mounting apertures 220 into the vertical surface. Alternatively, the guide tube 200 may be coupled to the vertical surface using an adhesive.

The lifting tube 240 may be an armature that slidably couples to the guide tube 200. The outside diameter of the lifting tube 240 may be less than the inside diameter of the guide tube 200 such that the lifting tube 240 may slide within the guide tube 200. The top of the lifting tube 240 may comprise a top lifting aperture 255 and a base slot 250 such that the mounting base 270 may detachably couple to the top of the lifting tube 240. The mounting base 270 may be coupled to the lifting tube 240 by sliding the mounting base 270 into the base slot 250 via the top lifting aperture 255.

The lifting tube 240 may comprise a lifting handle 245. The lifting handle 245 may couple to the lifting tube 240 on the same side of the lifting tube 240 that the mounting base 270 couples to the lifting tube 240. The lifting handle 245 may couple to the lifting tube 240 along the lower ½ of the lifting tube 240.

The mounting base 270 may be a circular plate upon which the detector 900 may be mounted. The mounting base 270 may comprise a mounting tab 275 and a plurality of base mounting apertures 280. The mounting tab 275 may be a lateral extension of the mounting base 270 that thickens to form a coupling member 285. The mounting base 270 may be coupled to the top of the lifting tube 240 by inserting the coupling member 285 into the top end of the lifting tube 240 such that the coupling member 285 is retained within the top of the lifting tube 240 and the mounting tab 275 passes through the base slot 250 of the lifting tube 240.

A detector mounting bracket 915 may be coupled to the mounting base 270 by passing detector mounting hardware 920 through the detector mounting bracket 915 and into the plurality of base mounting apertures 280. A detector body 910 may couple to the detector mounting bracket 915. The detector 900 may be held in a vertical orientation by the mounting base 270. The detector 900 may be moved to an elevated position 300 my lifting the lifting handle 245. The detector 900 may be moved to a lowered position 310 by lowering the lifting handle 245.

The height of the lifting tube 240 relative to the guide tube 200 may be maintained by a height lock 290. As a non-limiting example, the height lock 290 may be as simple as a friction fit between the lifting tube 240 and the guide tube 200 such that the lifting tube 240 slides at the urging of external vertical force applied to the lifting handle 245 but remains stationary in the absence of the external vertical force. As a further non-limiting example, the height lock 290 may be a pin or screw that passes through the guide tube 200, touches the lifting tube 240, and prevents movement of the lifting tube 240 when in place. As yet another non-limiting example, the height lock 290 may be the lifting handle 245 adapted to screw into the lifting tube 240 and to press against the guide tube 200 only when fully tightened. As the lifting handle 245 is unscrewed, the lifting handle 245 may move away from the guide tube 200 and allow movement of the lifting tube 240 within the guide tube 200. When fully tightened, the lifting handle 245 may press against the outside of the guide tube 200 and prevent movement of the lifting tube 240 within the guide tube 200.

In use, the lifting tube 240 may be slidably coupled to the guide tube 200 by inserting the lifting tube 240 into either end of the guide tube 200 and by moving the lifting tube 240 towards the center of the guide tube 200. The guide tube 200 may be coupled to the vertical surface using the plurality of guide mounting screws 225 or adhesive. If necessary, the lifting tube 240 may be raised or lowered to expose the plurality of guide mounting apertures 220 while coupling the guide tube 200 to the vertical surface. The mounting base 270 may be coupled to the top of the lifting tube 240 by sliding the coupling member 285 into the top lifting aperture 255 at the top of the lifting tube 240 and lowering the mounting base 270 such that the mounting tab 275 protrudes through the base slot 250. The detector 900 may be attached to the mounting base 270 by first coupling the detector mounting bracket 915 to the mounting base 270 using the detector mounting hardware 920 screwed into the plurality of base mounting apertures 280 on the mounting base 270 and then mounting the detector body 910 to the detector mounting bracket 915 using a twisting action. Detector indicators and controls will be exposed on the side of the detector 900 that is opposite the mounting base 270.

The detector 900 may be raised to the elevated position 300 by disengaging the height lock 290, lifting the lifting handle 245, and engaging the height lock 290. In some embodiments, the height lock 290 may be disengaged by moving the lifting handle 245 vertically.

The detector 900 may be lowered to the lowered position 310 by disengaging the height lock 290, lowering the lifting handle 245, and engaging the height lock 290. The detector body 910 may be dismounted from the detector mounting bracket 915 by twisting the detector body 910 and the detector body 910 may be removed from the detector mounting bracket 915 to provide access to a battery compartment 930. After replacing batteries, the detector 900 may be mounted to the detector mounting bracket 915 and raised to the elevated position 300 as described above.

Definitions

Unless otherwise stated, the words "up", "down", "top", "bottom", "upper", and "lower" should be interpreted within a gravitational framework. "Down" is the direction that gravity would pull an object. "Up" is the opposite of "down". "Bottom" is the part of an object that is down farther than any other part of the object. "Top" is the part of an object that is up farther than any other part of the object. "Upper" refers to top and "lower" refers to the bottom. As a non-limiting example, the upper end of a vertical shaft is the top end of the vertical shaft.

As used in this disclosure, an "aperture" is an opening in a surface. Aperture may be synonymous with hole, slit, crack, gap, slot, or opening.

Throughout this document the terms "battery", "battery pack", and "batteries" may be used interchangeably to refer to one or more wet or dry cells or batteries of cells in which chemical energy is converted into electricity and used as a source of DC power. References to recharging or replacing batteries may refer to recharging or replacing individual cells, individual batteries of cells, or a package of multiple battery cells as is appropriate for any given battery technology that may be used. The battery may require electrical contacts which may not be illustrated in the figures.

As used herein, the words "control" or "controls" are intended to include any device which can cause the completion or interruption of an electrical circuit; non-limiting examples of controls include toggle switches, rocker switches, push button switches, rotary switches, electromechanical relays, solid state relays, touch sensitive interfaces and combinations thereof whether they are normally open, normally closed, momentary contact, latching contact, single pole, multi-pole, single throw, or multi-throw.

As used herein, the words "couple", "couples", "coupled" or "coupling", refer to connecting, either directly or indirectly, and does not necessarily imply a mechanical connection.

As used in this disclosure, a "diameter" of an object is a straight line segment that passes through the center (or center axis) of an object. The line segment of the diameter is terminated at the perimeter or boundary of the object through which the line segment of the diameter runs.

As used herein, the term "friction fit" refers to a type of mechanical coupling where a first component presses into a second component and is held there only by the friction of the first component against the second component. A friction fit may also be known as an interference fit or a press fit.

As used in this disclosure, a "handle" is an object by which a tool, object, or door is held or manipulated with the hand.

As used herein, "inside diameter" or "inner diameter" refers to a measurement made on a hollow object. Specifically, the inside diameter is the distance from one inside wall to the opposite inside wall. If the object is round, then the inside diameter is a true diameter, however the term may also be used in connection with a square object in which case the inside diameter is simply the narrowest inside measurement that passes through the center of the object.

As used in this disclosure, the word "lateral" refers to the sides of an object or movement towards a side. Lateral directions are generally perpendicular to longitudinal directions. "Laterally" refers to movement in a lateral direction.

As used herein, "mounting hardware" refers to mechanical devices that are used to attach one object to another, including devices whose only purpose is to improve aesthetics. As non-limiting examples, mounting hardware may include screws, nuts, bolts, washers, crossbars, hooks, collars, nipples, standoffs, knobs, caps, plates, rails, and brackets.

As used in this disclosure, "orientation" refers to the positioning and/or angular alignment of a first object relative to a second object or relative to a reference position or reference direction.

As used herein, "outside diameter" or "outer diameter" refers to a measurement made on an object. Specifically, the outside diameter is the distance from one point on the outside of the object to a point on the opposite side of the object along a line passing through the center of the object. The term outside diameter is frequently used in conjunction with round objects such as hollow conduits in which case the outside diameter is a true diameter, however the term may also be used in connection with a square object in which case the outside diameter is simply the widest outside measurement that passes through the center of the conduit.

As used in this disclosure, a "plate" is a flat, rigid object having at least one dimension that is of uniform thickness and is thinner than the other dimensions of the object. Plates often have a rectangular or disk like appearance. Plates may be made of any material, but are commonly made of metal.

As used in this disclosure, a "slot" is a long narrow groove, cut, opening, or aperture that is formed in or through an object.

As used in this disclosure, a "tab" is an extension of an object for the purpose of facilitating the manipulation of the object, identifying the object, or attaching the object to another object.

As used in this disclosure, "vertical" refers to a direction that is parallel to the local force of gravity. Unless specifically noted in this disclosure, the vertical direction is always perpendicular to horizontal.

With respect to the above description, it is to be realized that the optimum dimensional relationship for the various components of the invention described above and in FIGS. 1 through 7, include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. A vertical track and sliding mount for a smoke detector comprising:
    a guide tube, a lifting tube, and a mounting base;
    wherein the mounting base is adapted to couple to a detector;
    wherein the detector is raised and lowered by sliding the lifting tube vertically within the guide tube;
    wherein a top of the lifting tube comprises a top lifting aperture and a base slot such that the mounting base detachably couples to the top of the lifting tube;
    wherein the mounting base is coupled to the lifting tube by sliding the mounting base into the base slot via the top lifting aperture.

2. The vertical track and sliding mount for a smoke detector according to claim 1
    wherein the guide tube is a hollow armature comprising a side slot along the length of the guide tube.

3. The vertical track and sliding mount for a smoke detector according to claim 2
    wherein the guide tube is coupled to a vertical surface in a vertical orientation.

4. The vertical track and sliding mount for a smoke detector according to claim 3
    wherein the guide tube comprises a top guide aperture and a bottom guide aperture such that the lifting tube slides into and out of the guide tube via either end of the guide tube.

5. The vertical track and sliding mount for a smoke detector according to claim 4
    wherein the guide tube comprises a plurality of guide mounting apertures located opposite the side slot;
    wherein the guide tube is coupled to the vertical surface using a plurality of guide mounting screws that pass through the side slot and the plurality of guide mounting apertures into the vertical surface.

6. The vertical track and sliding mount for a smoke detector according to claim 4
wherein the guide tube is coupled to the vertical surface using an adhesive.

7. The vertical track and sliding mount for a smoke detector according to claim 4
wherein the lifting tube is an armature that slidably couples to the guide tube.

8. The vertical track and sliding mount for a smoke detector according to claim 7
wherein the outside diameter of the lifting tube is less than the inside diameter of the guide tube such that the lifting tube slides within the guide tube.

9. The vertical track and sliding mount for a smoke detector according to claim 8
wherein the lifting tube comprises a lifting handle;
wherein the lifting handle couples to the lifting tube on the same side of the lifting tube that the mounting base couples to the lifting tube.

10. The vertical track and sliding mount for a smoke detector according to claim 9
wherein the lifting handle couples to the lifting tube along the lower ½ of the lifting tube.

11. The vertical track and sliding mount for a smoke detector according to claim 10
wherein the mounting base is a circular plate upon which the detector is mounted;
the mounting base comprises a mounting tab and a plurality of base mounting apertures;
wherein the mounting tab is a lateral extension of the mounting base that thickens to form a coupling member.

12. The vertical track and sliding mount for a smoke detector according to claim 11
wherein the mounting base is coupled to the top of the lifting tube by inserting the coupling member into the top end of the lifting tube such that the coupling member is retained within the top of the lifting tube and the mounting tab passes through the base slot of the lifting tube.

13. The vertical track and sliding mount for a smoke detector according to claim 12
wherein a detector mounting bracket is coupled to the mounting base by passing detector mounting hardware through the detector mounting bracket and into the plurality of base mounting apertures;
wherein a detector body couples to the detector mounting bracket.

14. The vertical track and sliding mount for a smoke detector according to claim 13
wherein the detector is held in a vertical orientation by the mounting base.

15. The vertical track and sliding mount for a smoke detector according to claim 14
wherein the detector is moved to an elevated position my lifting the lifting handle.

16. The vertical track and sliding mount for a smoke detector according to claim 15
wherein the detector is moved to a lowered position by lowering the lifting handle.

17. The vertical track and sliding mount for a smoke detector according to claim 16
wherein the height of the lifting tube relative to the guide tube is maintained by a height lock.

* * * * *